United States Patent
Shuey

(10) Patent No.: US 8,004,810 B2
(45) Date of Patent: Aug. 23, 2011

(54) METER HAVING LOAD CONTROL UNIT

(75) Inventor: Kenneth C. Shuey, Zebulon, NC (US)

(73) Assignee: Elster Electricity, LLC, Raleigh, NC (US)

( * ) Notice: Subject to any disclaimer, the term of this patent is extended or adjusted under 35 U.S.C. 154(b) by 671 days.

(21) Appl. No.: 12/141,449

(22) Filed: Jun. 18, 2008

(65) Prior Publication Data

US 2009/0316322 A1    Dec. 24, 2009

(51) Int. Cl.
*H02H 9/00* (2006.01)
(52) U.S. Cl. ........................................ 361/111
(58) Field of Classification Search .................. 361/111
See application file for complete search history.

(56) References Cited

U.S. PATENT DOCUMENTS

| | | | |
|---|---|---|---|
| 4,015,169 A | 3/1977 | Misencik | |
| 4,436,408 A * | 3/1984 | Inuzuka et al. | 399/33 |
| 4,688,138 A | 8/1987 | Nagata et al. | |
| 5,644,263 A | 7/1997 | Clark | |
| 5,684,443 A * | 11/1997 | Runyan et al. | 335/177 |
| 6,191,547 B1 * | 2/2001 | Fricke et al. | 318/547 |
| 6,634,338 B1 * | 10/2003 | Yamakado et al. | 123/490 |
| 6,639,444 B2 | 10/2003 | Ikeda et al. | |
| 7,746,054 B2 * | 6/2010 | Shuey | 324/110 |
| 2007/0205915 A1 | 9/2007 | Shuey et al. | |

FOREIGN PATENT DOCUMENTS

JP    1050759    2/1989

OTHER PUBLICATIONS

Keithley Instruments, Inc., Switching Handbook, 4th Edition, Jul. 2001, pp. 1-152, http:/www.keithley.com/servlet/Data?id=5974.

* cited by examiner

*Primary Examiner* — Stephen W Jackson
(74) *Attorney, Agent, or Firm* — Woodcock Washburn LLP

(57) ABSTRACT

A load control unit is provided for a meter which can be connected to a meter communication network. The load control unit includes a dual coil solenoid switch that is operable to connect the meter to a load, and disconnect the meter from the load. An electronic switching circuit is provided that reduces or eliminates undesirable braking in the solenoid switch.

15 Claims, 6 Drawing Sheets

METER HAVING LOAD CONTROL UNIT

BACKGROUND

The present invention relates to meters, and more particularly relates to meters having load control units configured to interrupt or shed loads at a customer location.

Loads at a customer location may be curtailed or interrupted during power system events for several reasons. Depending on the driver, the load reduction may be initiated by the utility or by the customer. For the customer, load reduction is generally an attempt to decrease energy consumption during certain periods of time to reduce costs. Predetermined loads such as HVAC, hot water heaters, pool pumps, or other high consumption devices can be selected for energy interruption to reduce the overall consumption when higher energy prices are in effect.

For the utility, load shedding at a customer site may be accomplished because of an abnormal condition on the power network. Abnormal conditions include events such as loss of transmission capability due to a line outage, loss of generation, loss of inter-tie to adjacent power networks, unusually high peak demand or similar type events. In this case the utility may take different steps to decrease consumption via load shedding. Load shedding can be initiated at the substation level using frequency-based relays. Many customers may contractually elect to have non-critical loads interrupted at customer premises for a reduction in overall energy costs. In order for this to be effective, the utility traditionally interrupts certain loads for a few minutes to maybe hours in order to reduce the overall load on a transmission network.

Conventional switch systems of the type illustrated in FIG. 1 provide an electronic circuit 20 that includes a dual-coil solenoid switch 22 fed from a DC supply voltage 24 on a positive supply line 26. The solenoid coils 22a, 22b can be energized with a current that causes an associated movable member (not shown) to move between a "connect" and "disconnect" position with respect to the load. The circuit 20 includes MOSFET devices 28 and 30 that are operable to ground either one of the solenoid coils independently, thereby allowing current to flow through the associated solenoid coil to a ground 31. Specifically, turning one of the MOSFET devices "on" causes current to flow through its respective solenoid coil to cause the movable member of the switch to move to one of the positions (i.e., either "connect" or "disconnect"). Turning that MOSFET device "off" and then turning the other MOSFET device "on" causes current to flow through the other respective solenoid coil to cause the movable member of the switch to move to the other position. Thus, the connect/disconnect switch can be selectively activated by turning one of the MOSFET devices "on" while the other remains "off."

Current flowing in an inductance coil (e.g., coil 22a or 22b) does not immediately dissipate to zero when the switch (e.g., MOSFET 28 or 30) in series with it begins to open. Depending on the inductor characteristics, the induction device may generate a high voltage associated with a quick rate of decrease in coil current (e=L di/dt), where "e" is the inductive voltage drop, "L" is the inductance of the coil, and "di/dt" is the rate of current change over time.

The inductive voltage can be sufficient to cause harm to the associated MOSFET device if an alternative path for current flow that bypasses the MOSFET device is not provided. Even if harm does not come to the associated MOSFET device, undesirable EMF noise can be developed due to the rapid rate of change of current.

Accordingly, in conventional connect/disconnect switch mechanisms such as that shown in FIG. 1, a pair of commutation diodes 32 and 34 is provided from the drain of each MOSFET to the positive supply line 26. The commutation diodes 32 and 34 are operable to provide a path for coil energy to be dissipated when a MOSFET device is switched off with current still flowing in the associated solenoid coil. When one of the MOSFET devices 28 or 30 stops conducting current, the inductance develops a reverse voltage equivalent to the diode voltage and the diode provides a path for a slow rate of decrease of current while preventing the development of potentially harmful high voltage conditions.

While electronic circuits of the type described above have proven useful for their intended purpose, electronic circuits providing for enhancements in load control are desirable.

SUMMARY

In accordance with one aspect of the present invention, a switch circuit is configured to be connected between a voltage source and a ground, and is operable to control a load disconnect switch in a meter. The switch circuit includes a solenoid switch including first and second solenoid coils. The solenoid coils are juxtaposed with a movable member such that current flow through the first solenoid coil provides a force that biases the movable member to move in a first direction, and current flow through the second solenoid coil provides a force that biases the movable member to move in a second direction. A diode is connected in parallel with the first solenoid coil. The diode prevents induced braking current from flowing through the first solenoid coil when current flows through the second solenoid coil.

BRIEF DESCRIPTION OF THE DRAWINGS

The foregoing summary, as well as the following detailed description, is better understood when read in conjunction with the appended drawings. There is shown in the drawings various embodiments, however the present invention is not limited to the specific methods and instrumentalities disclosed. In the drawings.

DETAILED DESCRIPTION OF ILLUSTRATIVE EMBODIMENTS

While systems and methods for gathering meter data in accordance with certain aspects of the present invention are described below with reference to FIGS. 2-3, the description given herein with respect to those figures is for exemplary purposes only and is not intended in any way to limit the scope of potential embodiments.

Generally, a plurality of meter devices, which operate to track usage of a service or commodity such as, for example, electricity, water and gas, may be operable to wirelessly communicate with each other and/or to communicate with one another via a wireline network. A collector may be operable to automatically identify and register meters for communication with the collector. When a meter is installed, the meter becomes registered with the collector that can provide a communication path to the meter. The collectors may receive and compile metering data from a plurality of meter devices via wireless communications. Also, a communications server communicates with the collectors to retrieve the compiled meter data.

Figure 2:
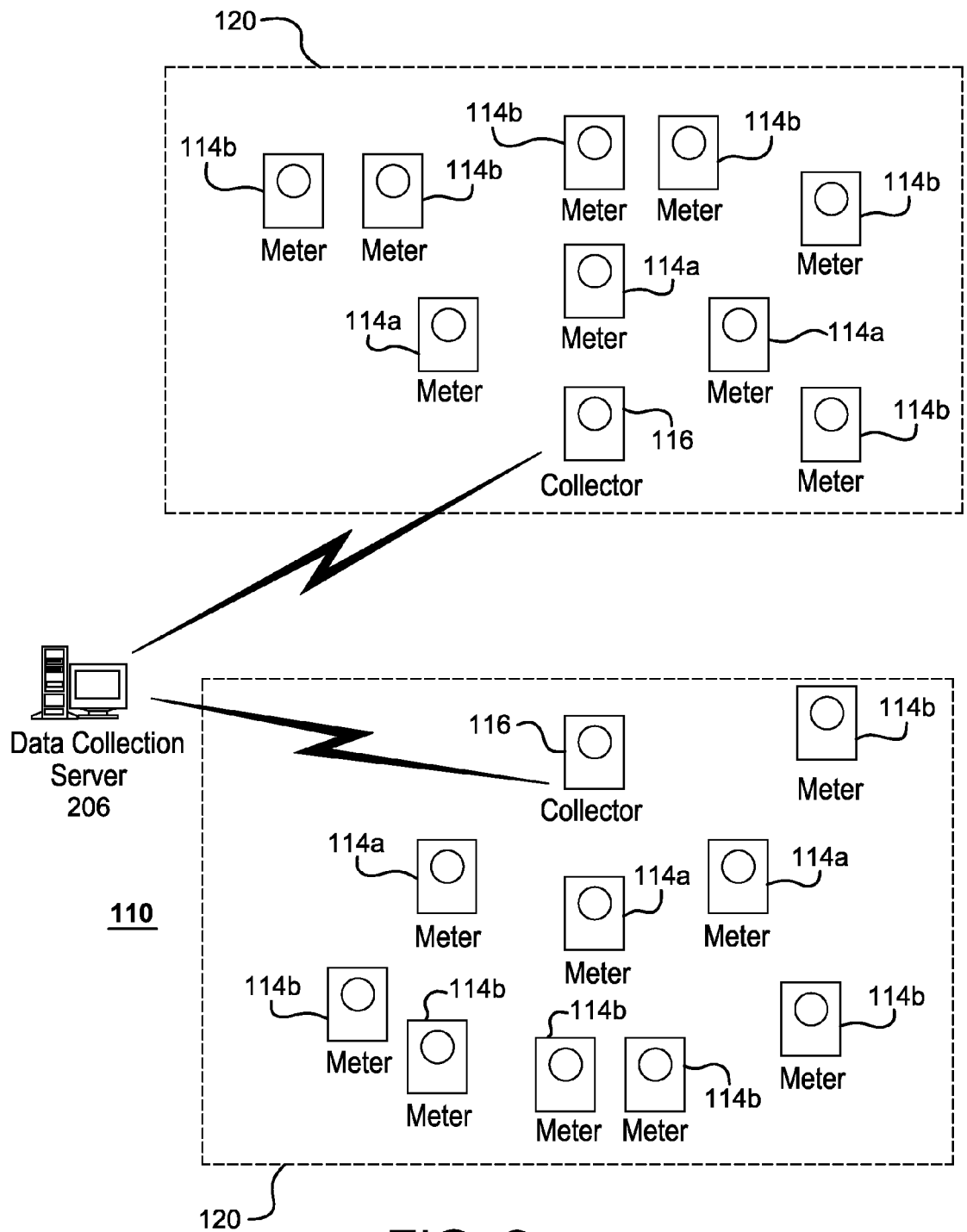
FIG. 2 is a diagram of a wireless system for collecting data from remote devices.

Referring to FIG. 2, an example metering system 110 includes a plurality of meters 114, which are operable to sense and record usage of a service or commodity such as, for example, electricity, water, or gas. The meters 114 may be located at customer premises such as, for example, a home or place of business. The meters 114 may comprise an antenna and may be operable to transmit data, including service usage data, wirelessly or via wired connections. The meters 114 may be further operable to receive data wirelessly as well. In an illustrative embodiment, meters 114 may be, for example, electrical meters manufactured by Elster Electricity, LLC.

The metering system 110 can further comprise one or more collectors 116. The collectors 116 are operable to detect and record usage of a service or commodity such as, for example, electricity, water, or gas, and can themselves be meters as well. The collectors 116 can include an antenna and are operable to send and receive data wirelessly to and from the meters 114. In an illustrative embodiment, the meters 114 and/or collectors 116 can be, for example, an electrical meter manufactured by Elster Electricity, LLC.

The metering system can further include a subnet/LAN 120 defined by a collector 116 and a plurality of associated meters 114 for which the collector 116 is configured to receive meter data. In the context of networking, the meters 114 and collectors 116 may be considered as nodes in the subnet 120. For each subnet/LAN 120, data can be collected at the collector 116 and periodically transmitted to a data collection server 206. The data collection server 206 can store the data for analysis and preparation of bills, for example, among other uses. The data collection server 206 can be a specially programmed general purpose computing system and may communicate with collectors 116 wirelessly or via a wireline connection such as, for example, a dial-up telephone connection or fixed wire network.

Generally, the collector 116 and the associated meters 114 can communicate with and among one another using any one of several-robust wireless techniques such as, for example, frequency hopping spread spectrum (FHSS) and direct sequence spread spectrum (DSSS) at 900 MHz. As illustrated, meters 114a may be referred to as "first level" meters that communicate with collector 116, and meters 114b may be referred to as "higher level" meters that communicate with other meters in the network and that forward information to the collector 116.

Figure 3:
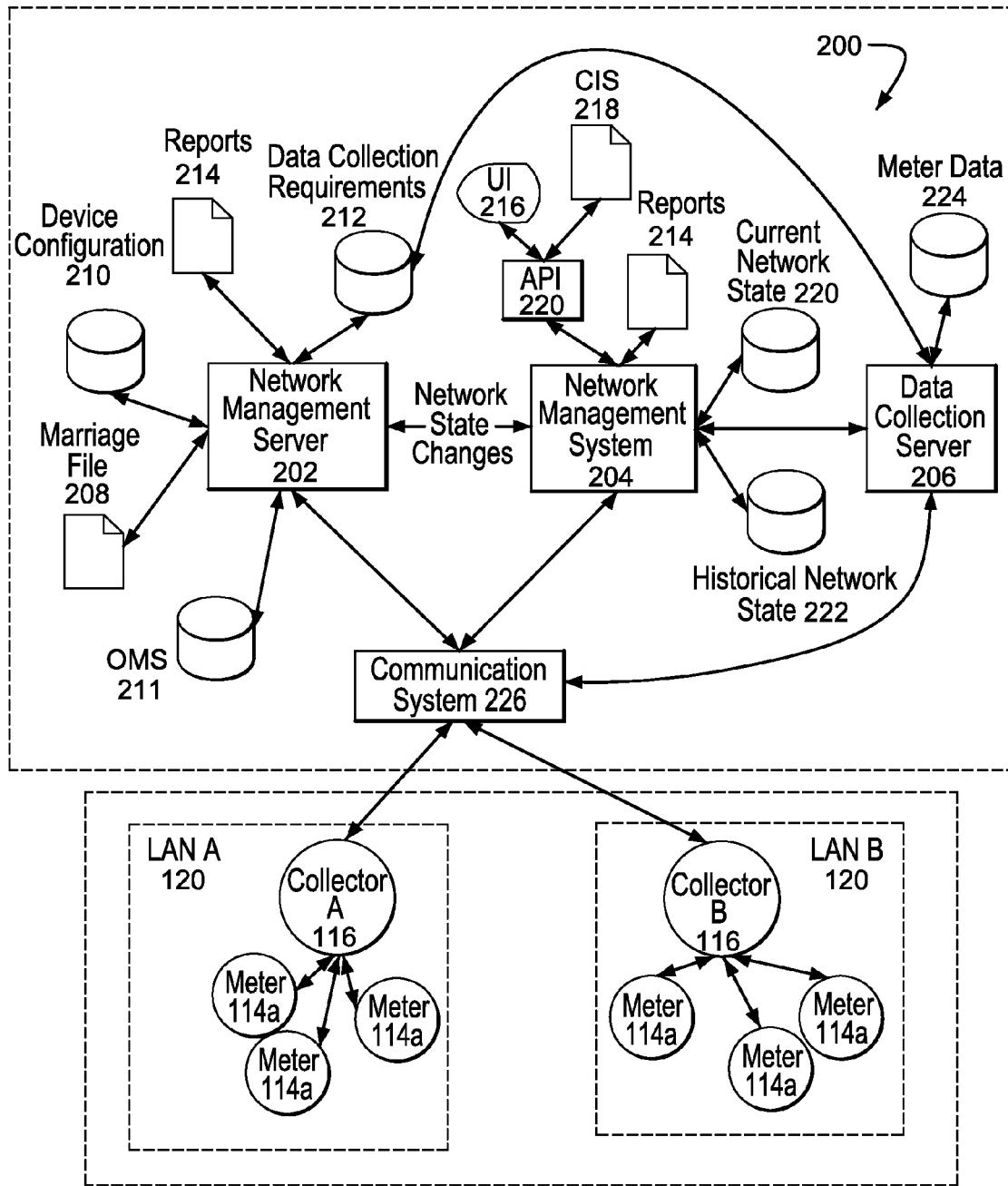
FIG. 3 expands upon the diagram of FIG. 2 and illustrates a system in which the present invention may be embodied.

Referring now to FIG. 3, a system 200 is illustrated that can include a network management server 202, a network management system (NMS) 204 and a data collection server 206 that together manage one or more subnets/LANs 120 and their constituent nodes. The NMS 204 can track changes in the network state, such as new nodes registering/unregistering with the system 200, node communication paths changing, etc. This information may be collected for each subnet/LAN 120 and may be detected and forwarded to the network management server 202 and data collection server 206.

Communication between nodes and the system 200 can be accomplished using a LAN identification, however customers also may query and communicate with nodes using their own identifier. To this end, a marriage file 208 can be used to correlate a customer serial number, a manufacturer serial number and LAN identification for each node (e.g., meters 114a and collectors 116) in the subnet/LAN 120. A device configuration database 210 can store configuration information regarding the nodes. For example, in the metering system 110, the device configuration database can include data regarding time of use (TOU) switchpoints, etc. for the meters 114a and collectors 116 communicating to the system 200. A data collection requirements database 212 can contain information regarding the data to be collected on a per node basis. For example, a user may specify that metering data such as load profile, demand, TOU, etc. is to be collected from particular meter(s) 114a. Reports 214 containing information on the network configuration can be automatically generated or in accordance with a user request.

As illustrated, a network management system (NMS) 204 maintains a database describing the current state of the global fixed network system (current network state 220) and a database describing the historical state of the system (historical network state 222). The current network state 220 may contain data regarding current meter to collector assignments, etc. for each subnet/LAN 120. The historical network state 222 may be a database from which the state of the network at a particular point in the past can be reconstructed. The NMS 204 can be responsible for, among other things, providing reports 214 about the state of the network. The NMS 204 may be accessed via an API 220 that is exposed to a user interface 216 and a Customer Information System (CIS) 218. Other external interfaces may be implemented as well. In addition, the data collection requirements stored in the database 212 may be set via the user interface 216 or CIS 218.

The data collection server 206 collects data from the nodes (e.g., collectors 116) and stores the data in a database 224. The data may include metering information, such as energy consumption and may be used for billing purposes, etc. by a utility provider.

The network management server 202, network management system 204 and data collection server 206 communicate with the nodes in each subnet/LAN 120 via a communication system 226. The communication system 226 may be a Frequency Hopping Spread Spectrum radio network, a mesh network, a Wi-Fi (802.11) network, a Wi-Max (802.16) network, a land line (POTS) network, TCP/IP network, etc., or any combination of the above that enables the system 200 to communicate with the metering system 110.

Figure 1:
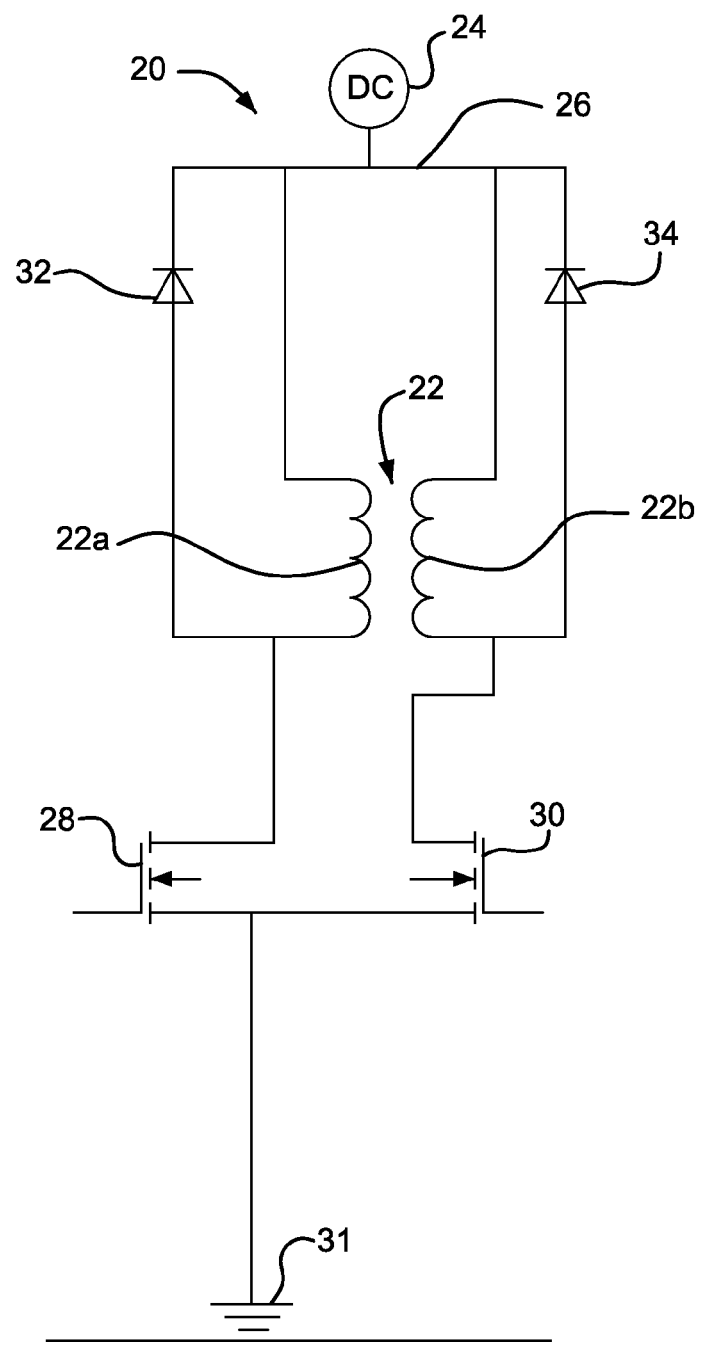
FIG. 1 illustrates an example circuit schematic of a conventional load control unit.
Figure 4:
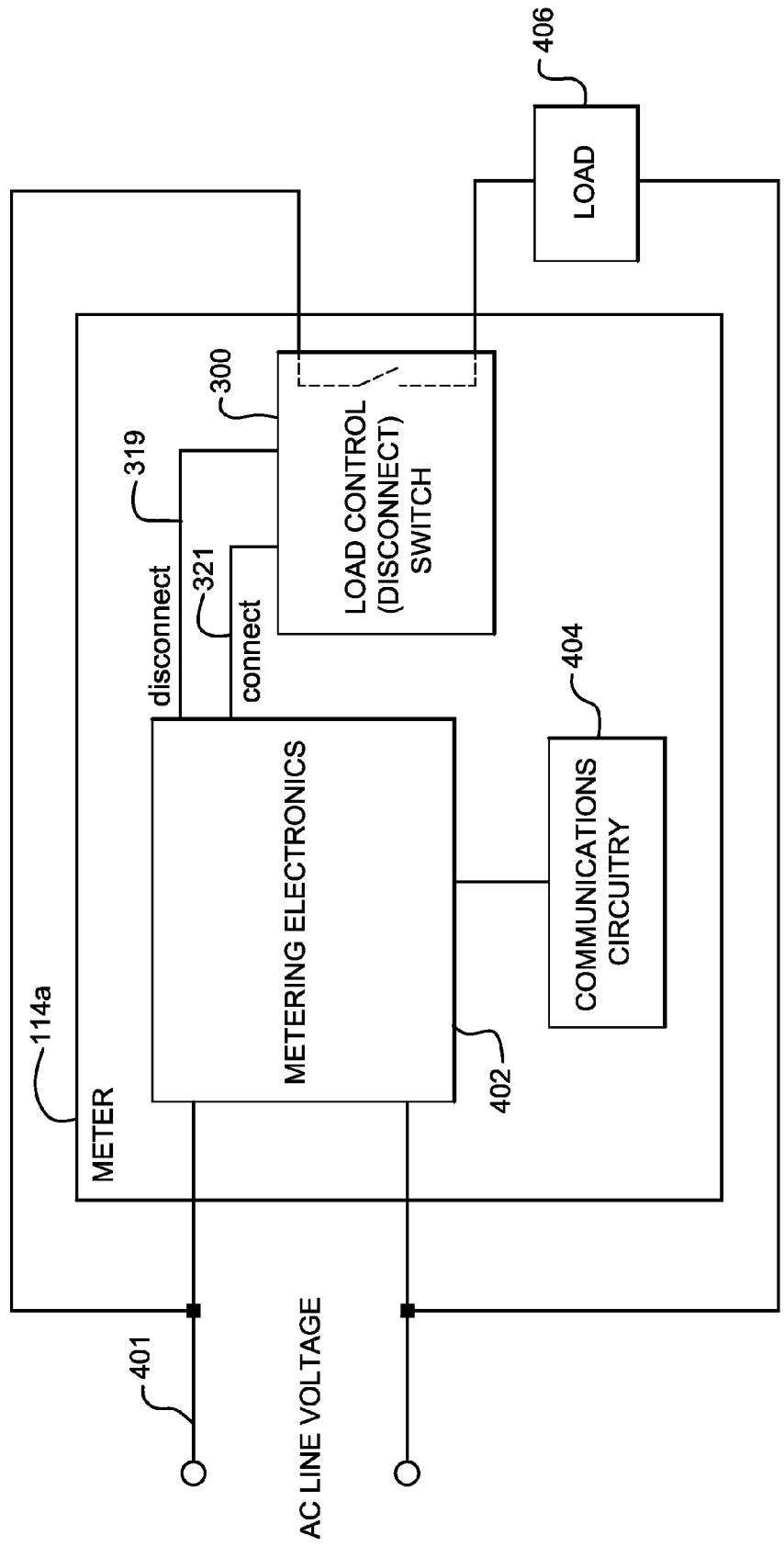
FIG. 4 illustrates example communication links to an in-home display and load control device.

Referring now to FIG. 4, additional details of an example meter 114a, such as one of the meters 114 of the system shown in FIGS. 2 and 3, are shown. The example meter 114a is connected to the power line 401 at a metering site and includes conventional metering electronics 402 that receive a measure of the AC power line voltage at the metering site and calculate energy consumption at the site, as well as performing other convention metering operations. The meter 114a also includes communications circuitry 404, such as circuitry that enables the meter to communicate wirelessly in the system of FIGS. 2 and 3. In other embodiments, the communications circuitry 404 may comprise circuitry that enables the meter to communicate via other means, such as via a telephone network or the power line network. As further shown, the meter 114a includes a load control (or service disconnect) switch circuit 300 that enables the meter to interrupt power to a load 406 at the metering site. The "open" or "closed" position of the switch circuit 300 is controlled by respective "connect" and "disconnect" signals provided to the switch circuit 300 on lines 321 and 319, respectively. In the present embodiment, the switch is of the dual-coil solenoid type such as that described in connection with FIG. 1. A drive signal provided on line 321 will cause the switch to move to its closed (i.e., connected) position such that the load is connected to the power line. A drive signal provided on line 319 will cause the switch to move to its open (i.e., disconnected) position such that the load is disconnected from the power line. Load control switches, like switch 306, can also be provided within load control units that are separate from the meter 114a and that may be activated by transmitting the "connect" and "disconnect" signals to the load control unit either from a meter or from another communications source. The switch circuit of the present invention can be employed in either environment, i.e., within a meter or within a separate load control unit.

Still referring to FIG. 4, in an exemplary use, a command from the system 200 of FIG. 3 may be transmitted to the meter 114a of FIG. 4 and received by the communications circuitry 404. The command may direct the meter to "shed" its load by opening the load control/disconnect switch 306. The metering electronics may then respond to the command by driving a signal on line 319 to cause the switch to open, thus disconnecting the load from the power line.

Figure 5:
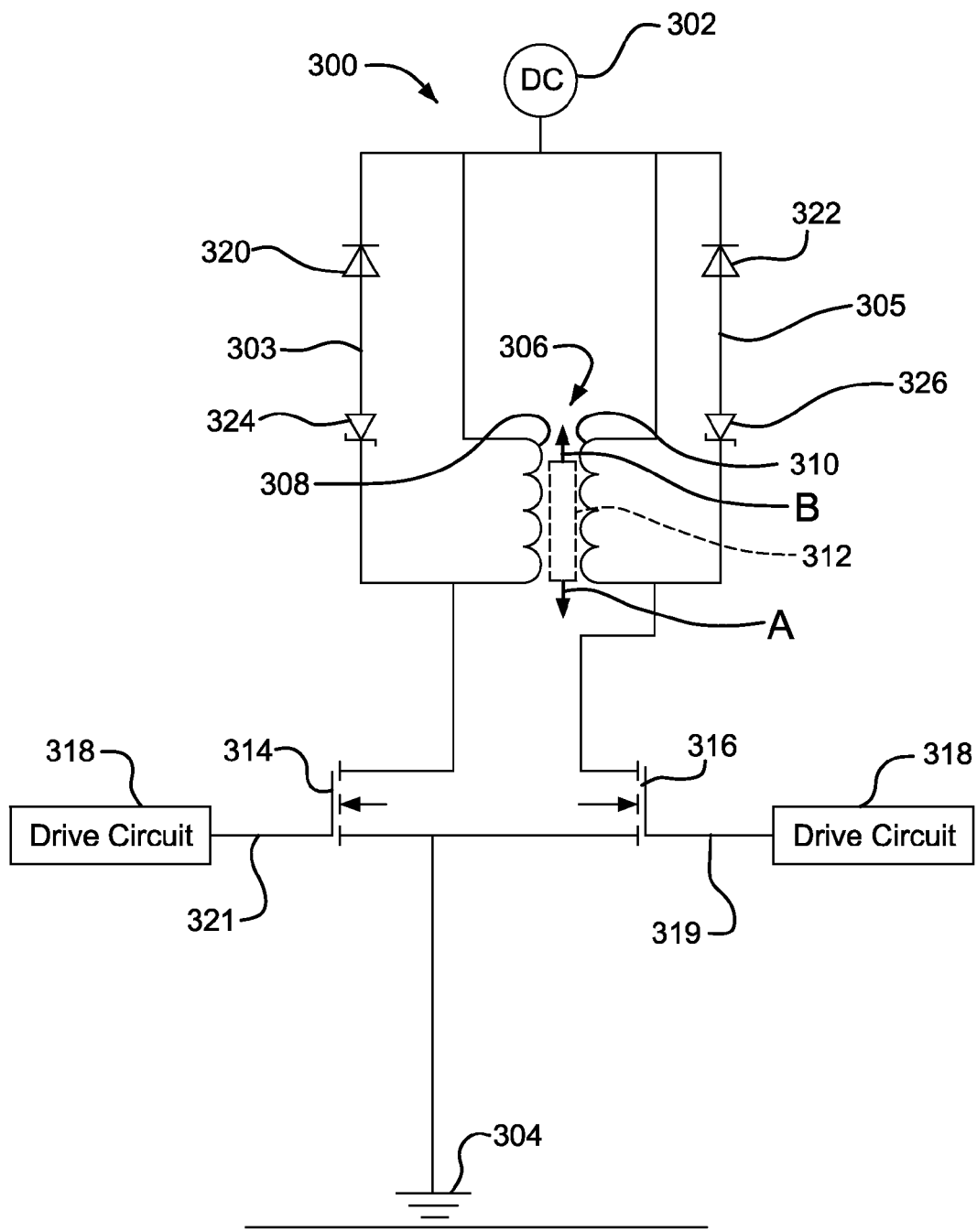
FIG. 5 illustrates an example circuit schematic of a load control unit constructed in accordance with an embodiment of the present invention.

Referring now to FIG. 5, one embodiment of an electronic switch circuit 300 is provided for providing load control that can operate with greater efficiency with respect to conventional electronic load control circuits. This switch circuit 300 may be used, for example, to implement the switch circuit 300 of FIG. 4. The switch circuit 300 is electrically connected between a supply voltage source 302, which can be a DC voltage source or an AC voltage source that is converted to DC, and a ground 304. The switch circuit 300 includes a solenoid switch 306, which can be provided as a dual-coil solenoid switch. Accordingly, the switch circuit 300 includes a first coil circuit 303 and a second coil circuit 305. The first coil circuit 303 includes a first solenoid coil 308, and the second coil circuit 305 includes a second solenoid coil 310, each being juxtaposed with a movable member, such as a ferromagnetic armature 312. The solenoid coils 308 and 310 are each connected in series with, and disposed downstream of, the voltage source 302, which can provide an operating voltage to the coils 308 and 310 at a level sufficient (for instance 18-20 V) to energize the coils to cause movement of the armature 312. The first coil 308 can provide a "close" coil that closes the solenoid switch 306 when energized, and the second coil 310 can provide a "release" coil that opens the solenoid switch 306 when energized.

It should be appreciated that the term "downstream" when used in connection with the electronic switch circuit 300 refers to a direction of current flow from the voltage source 302 toward the ground 304. Conversely, the term "upstream" when used in connection with the electronic switch circuit 300 refers to a direction opposite that of the downstream direction.

In a dual-coil, magnetically held circuit breaker, a permanent magnet is provided to create a constant background level of potential magnetic field. This constant level of magnetic field holds the moveable armature in the closed solenoid position after application of a close pulse. The direction of the magnetic field due to the permanent magnet is in a direction to aid the applied "close" coil 308 current and oppose the applied release coil 310 current. As a result, the "close" coil 308 magnetic field plus the permanent magnet magnetic field create a magnetic field sufficient to close the solenoid. The "release" coil 310 magnetic field minus the permanent magnet magnetic field create a low magnetic field in the moveable armature 312 which allows mechanical springs to move the armature 312 into the open solenoid position and hold it there.

When the first coil 308 is energized, current flow through the coil induces a magnetic field having a polarity that biases the armature 312 to translate along the direction indicated by Arrow A, thereby causing the meter 114a to connect the line to the load. When the second coil 310 is energized (and the first coil is no longer energized), current flow through the coil induces a magnetic field having a polarity opposite to the polarity of the first coil 308, such that the polarity induced by the second coil 310 biases the armature 312 to translate along an opposite direction indicated by Arrow B, which causes the meter 114 to disconnect from the load.

The switch circuit 300 can further include one or more switching devices that are operable to selectively control the flow of current to the solenoid coils 308 and 310. In the illustrated embodiment, a first switching device 314 is connected in series with the first solenoid coil 308, and a second switching device 316 is connected in series with the second solenoid coil 310. The switching devices 314 and 316 can be in the form of any suitable bi-polar device, or can alternatively be in the form of a transistor, such as a field-effect transistor (FET). In accordance with one embodiment of the present invention, the switching devices 314 and 316 can each be provided as a metal-oxide semiconductor field-effect transistor (MOSFET).

If the switching devices 314 and 316 are provided as MOSFET-type transistors, a drive circuit 318 (which may be part of the metering electronics 402 of meter 114a of FIG. 4) can selectively apply a gate voltage to the switching devices under the control of a microprocessor (not shown). Each switching device can be driven by a common drive circuit, or by separate drive circuits that can be controlled by a common microprocessor or separate microprocessors. Accordingly, when a gate voltage is applied to the first switching device 314 (via, for example, line 321), current will flow through the first solenoid coil 308, and through the drain and source of the switching device 314 to ground. Likewise, when a gate voltage is applied to the second switching device 316 (via, for example, line 319), current will flow through the second solenoid coil 310, and through the drain and source of the switching device 314. By selectively applying a gate voltage to the switching devices, the position of the armature 312, and thus the state of the disconnect switch, can be controlled.

The switch circuit further includes a pair of diodes connected to the voltage source 302 in parallel with the solenoid coils 308 and 310. Specifically a first commutation diode 320 is connected in parallel with the first solenoid coil 308 on the first coil circuit 303, and a second commutation diode 322 is connected in parallel with the second solenoid coil 310 on the second coil circuit. The diodes 320 and 322 define a forward conducting path in a direction from the ground 304 toward the voltage source and block the forward conducting path in a direction from the voltage source to ground. Accordingly, when the current applied to one of the solenoid coils 308 or 310 is discontinued, the inductance in the coil develops a reverse voltage and the diode provides a path for a slow rate of decrease of current while preventing the development of potentially harmful high voltage conditions. The coil currents are thus able to dissipate while bypassing the associated switching device 314 or 316. Additionally, when voltage is applied to one of the solenoid coils 308 or 310, the associated diode 320 or 322, respectively, prevents current generated at the voltage source 302 from flowing to the ground 304 instead of passing through the solenoid coil.

Certain aspects of the present invention recognize that normal application of operating voltage to the solenoid coils 308 and 310 creates a buildup of coil current and a change of magnetic flux in the solenoid magnetic circuit. The dual-coil solenoid switch 306 can have both coils wound on the same insulating bobbin surrounding the ferrous armature 312 that carries the electromagnetic flux. In one embodiment, the armature 312 provides a movable member that is put in motion as operating current is applied to the coils 308 and 310. In alternative embodiments, the movable member can be in the form of other electromagnetic components (such as a permanent magnet, not shown) that move as the coils 308 and 310 are energized between an open, or disconnected, position whereby the line is electrically disconnected from the load, and a closed, or connected, position whereby the line is electrically connected to the load, while the armature 312 remains stationary.

In both embodiments, movement of the movable member can cause changes in the coil inductance as the magnetic gap begins to increase or decrease. The solenoid switch 306 can be designed to determine how tightly the "close" and "release" coils 308 and 310 are coupled to the armature 312, and how quickly coil current can build. The electromechanical design can further determine the speed at which the movable member moves.

The design characteristics can create situations where voltage is induced in the solenoid coil that is not being energized by the voltage source 302. For instance, when the "close" solenoid coil 308 is energized, coil current buildup as well as movement of the movable member can induce a voltage in the opposing "release" coil 310. In the conventional electronic circuit illustrated in FIG. 1, induced voltage would be capable of causing current to flow in the circuit that includes the non-energized solenoid coil and diode, which would steal energy from the desired coil and possibly induce a force on the associated armature that biases the armature to move in a direction opposite the intended direction of movement. Accordingly, when energizing the solenoid coil so as to close the disconnect switch to connect the load to the line, the induced current in the other coil produces a so-called "braking" force on the armature that opposes the direction of intended movement. While the opposing force is less than the intended force such that the armature is able to move in the intended direction, the efficiency of the switching circuit is reduced and the operate voltage requirement may increase.

Accordingly, in accordance with one aspect of the present invention, the electronic switch circuit 300 includes a pair of bi-directional transient protection devices. Specifically, a first bi-directional transient protection device 324 is connected in series with the first commutation diode 320 on the first coil circuit 303 and in parallel with the first solenoid coil 308, and a second bi-directional transient protection device 326 is connected in series with the second commutation diode 322 on the second coil circuit and in parallel with the second solenoid coil 310. Each bi-directional transient protection device 324 and 326 can be provided as a Zener diode that defines a forward conducting path in a direction from the voltage source 302 toward the ground 304.

Each Zener diode 324 and 326 thus prevents any induced "braking" current from flowing through the associated solenoid coil and the associated coil circuit when the associated switching device is open (i.e., in the non-energized coil) so long as the induced current defines a voltage that is less than the breakdown voltage of the Zener diodes 324 and 326. Accordingly, it may be desirable to provide each Zener diode having a breakdown voltage sufficiently high such that voltage induced in the non-energized coil resulting from movement of the movable member, such as armature 312, is not able to flow in the associated coil circuit and apply a braking force. Alternatively, if the breakdown voltages are slightly lower than the maximum induced voltage in the non-energized coil, braking will occur only momentarily until the induced voltage dissipates to a level below the breakdown voltage.

At the same time, it is recognized that the breakdown voltage of the Zener diode will determine the rate of decrease of the current in the associated coil circuit when the associated coil is deenergized (i.e., when the associated switching device is opened). As a result, once the current in the denergizing coil circuit dissipates to zero, the zener current will cease and source voltage will be blocked by the open switching device. It may be desirable to provide each Zener diode having a breakdown voltage sufficiently low such that voltage applied to the open switching device will not harm the device or otherwise create undesirable EMF noise. Otherwise stated, when the switching devices 314 and 316 are provided as MOSFETs, it may be desirable to configure the MOSFET standoff voltage to be greater than the breakdown voltage of the associated Zener diodes 324 and 326 plus the DC supply voltage. In accordance with one embodiment, the Zener diodes 324 and 326 have a breakdown voltage between 20-30 volts, for instance 22-24 V. In one embodiment, the breakdown voltages of the Zener diodes 324 and 326 are substantially equal or equal.

While each coil circuit 303 and 305 has been described as including an anti-braking transient protection device 324 and 326, to prevent or reduce braking regardless of whether the solenoid switch 306 has been activated to connect or disconnect the load, it should be appreciated that an anti-braking transient protection device can be provided on only one of the coil circuits, if desired, to selectively prevent or reduce braking when the load is to be connected or disconnected.

Figure 6:
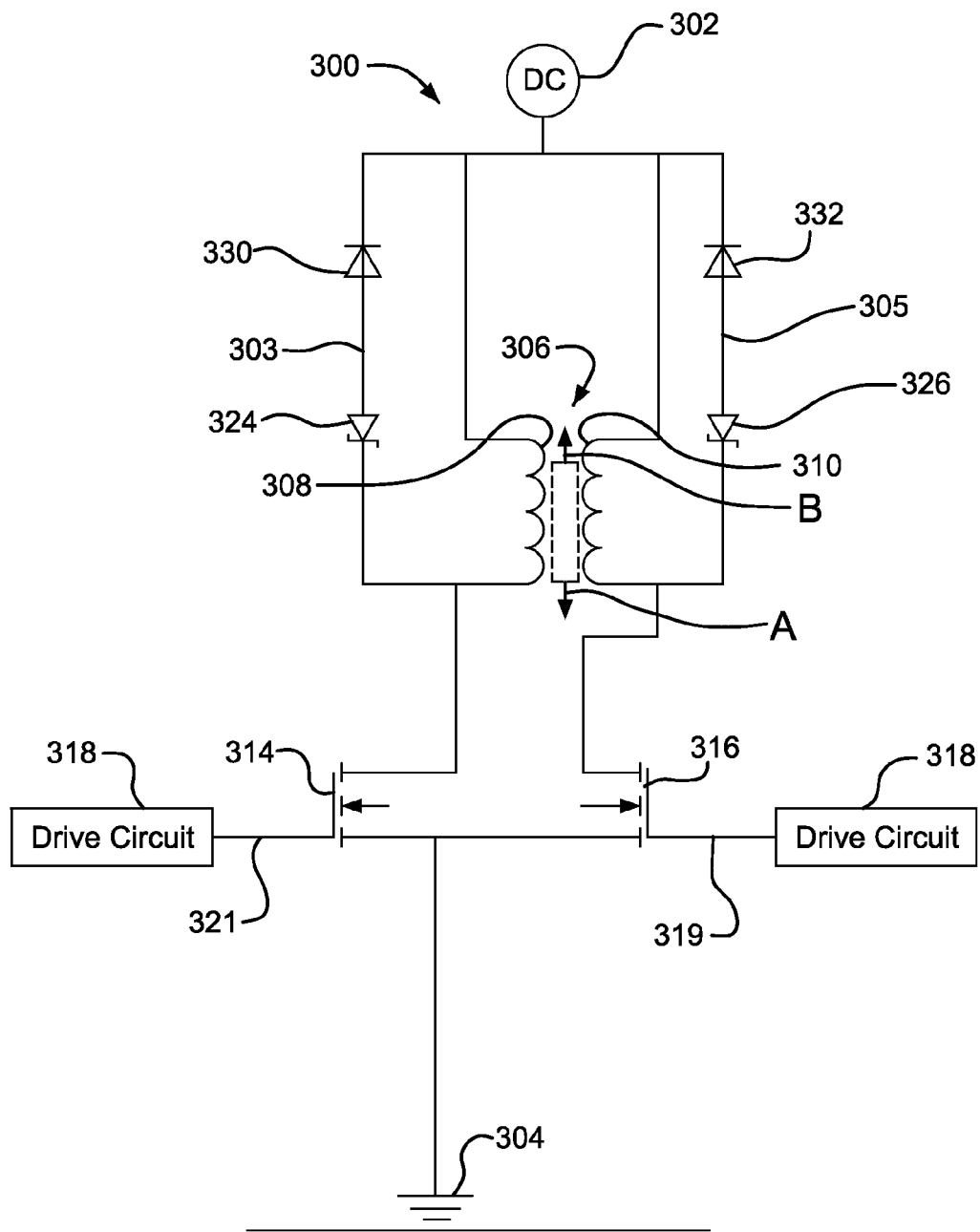
FIG. 6 illustrates an example circuit schematic of a load control unit constructed in accordance with another embodiment of the present invention.

Referring now to FIG. 6, it should be appreciated that the electronic switch circuit 300 can be constructed in a manner similar to that illustrated in FIG. 5, however the commutation diodes 320 and 322 can be replaced by transient protection devices, such as Zener diodes 330 and 332. Alternatively, the diode pairs 330 and 324, and diode pairs 332 and 326 can be replaced with a bi-directional Transzorb. The Zener diodes 330 and 332 can be provided with a breakdown voltage at least equal to or greater than the voltage provided by the voltage source 302 (for instance, 22-24 V). The breakdown voltages of the Zener diodes 330 and 332 can be greater than, less than, or equal to the breakdown voltages of the Zener diodes 324 and 326, and the standoff voltage of the MOSFETs 314 and 316 are less than the breakdown voltages of the Zener diodes 324 and 326. Accordingly, the Zener diodes 330 and 332 prevent voltage applied from the voltage source 302 from bypassing the intended solenoid coil 308 or 310 while, at the same time, allowing induced voltage that results from the discontinuation of current flow to the solenoid coil to flow through the respective coil circuit and dissipate to a level that will not harm the associated switching device or cause needless EMF noise. In one embodiment, the breakdown voltages of the Zener diodes 324 and 326 are substantially equal or equal.

In another embodiment it may be desirable to insert small values of resistance in series with the Zener diodes 324 and 326 to make minor adjustments to the operation of the commutation circuits and further reduce coil to coil interaction during operate or release pulses.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims.

While systems and methods have been described and illustrated with reference to specific embodiments, those skilled in the art will recognize that modification and variations can be made without departing from the principles described above and set forth in the following claims. For example, although in the embodiments described above, the systems and methods of the present invention are described in the context of a network of metering devices, such as electricity, gas, or water meters, it is understood that the present invention can be implemented in any kind of network. Also, while the example metering system described above is a fixed network, the present invention can also be employed in mobile (walk by/drive by) systems. Accordingly, reference should be made to the following claims as describing the scope of the present invention.

What is claimed:

1. A switch circuit configured to be connected between a voltage source and a ground, and operable to connect a load to, and disconnect the load from, a power line, the switch circuit comprising:
   a solenoid switch including first and second solenoid coils, wherein the solenoid coils are juxtaposed with a movable member such that current flow through the first solenoid coil provides a force that biases the movable member to move in a first direction, and current flow through the second solenoid coil provides a force that biases the movable member to move in a second direction; and
   a transient protection device connected in parallel with the first solenoid coil, wherein the transient protection device prevents induced braking current from flowing through the first solenoid coil when current flows through the second solenoid coil.

2. The switch circuit as recited in claim 1, wherein the transient protection device is disposed downstream from the voltage source, and defines a forward conducting path in a direction from the voltage source towards a ground.

3. The switch circuit as recited in claim 2, further comprising a switching device connected in series with the first solenoid coil, wherein the switching device controls current flow through the first solenoid coil.

4. The switch circuit as recited in claim 3, wherein the transient protection device is a first diode, and the switch circuit further comprises a second diode connected in series with the first diode, and the second diode provides a forward conducting path in a direction from the ground toward the voltage source so as to prevent current from flowing from the voltage source to the switching device without first flowing through the first solenoid coil.

5. The switch circuit as recited in claim 4, wherein the second diode provides a voltage dissipation path from the second solenoid coil that bypasses the switching device, such that voltage induced in the first solenoid coil causes current to flow through the voltage dissipation path.

6. The switch circuit as recited in claim 4, wherein the second diode is disposed between the first diode and the voltage source.

7. The switch circuit as recited in claim 4, first diode is a Zener diode.

8. The switch circuit as recited in claim 7, wherein the second diode is a Zener diode.

9. The switch circuit as recited in claim 8, wherein the first diode has a first breakdown voltage, and the second diode has a second breakdown voltage, and the first breakdown voltage is less than the second breakdown voltage.

10. The switch circuit as recited in claim 4, wherein the switching device is a first switching device, the circuit further comprising a second switching device connected in series with the second solenoid coil, wherein the switching device controls current flow through the second solenoid coil.

11. The switch circuit as recited in claim 10, wherein the first and second switching devices are controlled to selectively allow current to flow through one of the solenoid coils so as to iterate the movable member between a connected position whereby a load is electrically connected from the meter and a disconnected whereby a load is electrically disconnected from the meter.

12. The switch circuit as recited in claim 4, further comprising:
   a third diode connected in parallel with the second solenoid coil and disposed downstream from the voltage source, wherein the third diode provides a forward conducting path in a direction from the voltage source towards the ground so as to prevent induced current from flowing through the second coil when current flows through the first coil; and
   a fourth diode connected in series with the first diode, wherein the second diode provides a forward conducting path in a direction from the ground toward the voltage source so as to prevent current from flowing from the voltage source to the second switching device without first flowing through the second solenoid coil.

13. A switch circuit configured to be connected between a voltage source and a ground, and operable to connect a load to, and disconnect the load from, a power line, the switch circuit comprising:
   a solenoid switch including first and second solenoid coils, wherein the solenoid coils are juxtaposed with a movable member such that current flow through the first solenoid coil provides a force that biases the movable member to move in a first direction, and current flow through the second solenoid coil provides a force that biases the movable member to move in a second direction; and
   a first transient protection device connected in parallel with the first solenoid coil, wherein the first transient protection device prevents induced braking current from flowing through the first solenoid coil when current flows through the second solenoid coil
   a second transient protection device connected in parallel with the second solenoid coil, wherein the second transient protection device prevents induced braking current from flowing through the second solenoid coil when current flows through the first solenoid coil.

14. The switch circuit as recited in claim 13, further comprising a first switching device connected in series with the first solenoid coil, and a second switching device connected in series with the second solenoid coil, wherein each switching device controls current flow through the respective connected solenoid coil.

15. The switch circuit as recited in claim 14, wherein the first and second transient protection devices comprise first and diodes, respectively, and the switch circuit further comprises:

a third diode connected in series with the first diode, wherein the third diode prevents current from flowing from the voltage source interface to the switching device without first flowing through the first solenoid coil; and a fourth diode connected in series with the second diode, wherein the fourth diode prevents current from flowing from the voltage source interface to the second switching device without first flowing through the second solenoid coil.

* * * * *